United States Patent
Schoellkopf et al.

(10) Patent No.: US 7,521,764 B2
(45) Date of Patent: Apr. 21, 2009

(54) ONE-TIME PROGRAMMABLE MEMORY DEVICE

(75) Inventors: Jean-Pierre Schoellkopf, Grenoble (FR); Richard Fournel, Lumbin (FR)

(73) Assignee: STMicroelectronics SA, Montrouge (FR)

( * ) Notice: Subject to any disclaimer, the term of this patent is extended or adjusted under 35 U.S.C. 154(b) by 384 days.

(21) Appl. No.: 11/142,661

(22) Filed: Jun. 1, 2005

(65) Prior Publication Data

US 2006/0054952 A1   Mar. 16, 2006

(30) Foreign Application Priority Data

Jun. 4, 2004   (FR) .................................. 04 06077

(51) Int. Cl.
  *H01L 29/76* (2006.01)
(52) U.S. Cl. .................. 257/390; 257/321; 257/651; 257/903; 257/E27.102
(58) Field of Classification Search ................. 257/321, 257/390, 651, 903, E27.102; 365/103, 104
See application file for complete search history.

(56) References Cited

U.S. PATENT DOCUMENTS

| 5,553,022 | A | 9/1996 | Weng et al. ............. 365/189.01 |
| 5,825,686 | A | 10/1998 | Schmitt-Landsiedel et al. ...................... 365/185.03 |
| 6,522,582 | B1 * | 2/2003 | Rao et al. ............... 365/185.08 |
| 7,283,402 | B2 * | 10/2007 | Randolph et al. ....... 365/185.29 |
| 2004/0047218 | A1 | 3/2004 | Peng ........................... 365/221 |

\* cited by examiner

*Primary Examiner*—Matthew E Warren
(74) *Attorney, Agent, or Firm*—Lisa K. Jorgenson; Robert Iannucci; Seed IP Law Group PLLC

(57) ABSTRACT

A one-time programmable, dual-bit memory device comprises one MOS storage transistor having a semiconductor substrate, first and second active regions formed under the surface of the substrate being separated by a part of the substrate forming a channel region, a gate formed on the surface of the said substrate in line with the channel region and whose respective distal ends are aligned with a part of the first active region and with a part of the second active region, respectively, which gate is permanently held at ground potential, and a gate oxide layer running between the gate and the surface of the substrate. The intact or broken down state between the gate and the first active region determines a stored value of a first bit, and the intact or broken down state between the gate and the second active region determines a stored value of a second bit.

19 Claims, 2 Drawing Sheets

ONE-TIME PROGRAMMABLE MEMORY DEVICE

BACKGROUND OF THE INVENTION

1. Field of the Invention

The present invention relates generally to one-time programmable (or OTP) memory devices. Such devices are non-volatile memories, and are in general electrically programmable.

2. Description of the Related Art

The invention relates in particular to a dual-bit OTP device, in other words incorporating a pair of memory cells each capable of storing one bit of information. It also relates to a memory comprising such a memory device, and to methods of writing and reading within such a memory.

In particular, the invention has applications for the storage of information in integrated circuits (ICs). Such information can, for example, be an encryption key used in a chip card of the bank card or similar type, an identification code or, alternatively, a configuration code for such a card, etc.

From the document U.S. Pat. No. 5,553,022, an integrated circuit identification device is known comprising a plurality of memory cells each having an inverter with a MOS transistor of the n type (n-MOS) and a MOS transistor of the p type (p-MOS) in series between two power supply terminals, together with a gate driver coupled to the gate of the n-MOS transistor. In order to program the memory cell, the inverter is permanently modified by inducing the breakdown of the oxide (dielectric) layer that runs between the gate and the substrate (or "bulk") of the n-MOS transistor. This is achieved by holding the gate at ground potential and applying a high voltage to the bulk. The modified, or otherwise, state of the inverter is monitored during a memory cell read operation, by the detection of the on-state or off-state of the n-MOS transistor when normal voltages for driving this transistor into conduction are applied. The drawback of this prior art is the relatively large number of transistors, namely four, required to form a memory cell.

Now, in integrated circuits, ways of reducing the silicon surface area occupied by the devices are continually being sought, so as to increase the level of integration.

BRIEF SUMMARY OF THE INVENTION

One embodiment of the invention proposes a one-time programmable, dual-bit memory device that comprises one MOS storage transistor, a first MOS access transistor for access to the first bit, and a second MOS access transistor for access to the second bit.

The MOS storage transistor comprises:
a semiconductor substrate permanently held at ground potential,
first and second active regions formed under the surface of the substrate being separated from each other by a part of the substrate forming a channel region,
a gate formed on the surface of the substrate in line with the channel region and whose respective distal ends are aligned with a part of the first active region and with a part of the second active region, respectively, which gate is permanently held at ground potential, and
a gate oxide layer running between the gate and the surface of the substrate, whose intact or broken down state between the gate and the first active region determines the stored value of a first bit, and whose intact or broken down state between the gate and the second active region determines the stored value of a second bit.

The first MOS access transistor is formed on the substrate surface and comprises:
a gate designed to be connected to a first word line,
a first active region designed to be connected to a bit line, and
a second active region connected to the first active region of the MOS storage transistor.

The second MOS access transistor is formed on the substrate surface and comprises:
a gate designed to be connected to a second word line,
a first active region designed to be connected to a bit line, and
a second active region connected to the second active region of the MOS storage transistor.

Such a device actually incorporates two memory cells which can be independently written or read. Each memory cell comprises half a transistor, more particularly half of the MOS storage transistor, together with one of the access transistors. A memory cell therefore occupies a surface area corresponding to 1.5 times that of a transistor alone. It can thus be considered that the memory cell only requires 1.5 transistors/bit (3 transistors for 2 bits).

A second embodiment of the invention relates to a one-time programmable memory comprising:
a first word line and a second word line, together with at least one bit line,
a memory device according to the first embodiment, whose first access transistor is connected via its gate to the said first word line and via its first active region to the said bit line, and whose second access transistor is connected via its gate to the said second word line and via its first active region to the said bit line.

A third embodiment of the invention relates to a writing method for a memory cell, comprising a MOS storage transistor, having:
a semiconductor substrate,
first and second active regions formed under the surface of the substrate being separated by a part of the substrate forming a channel region,
a gate formed on the surface of the said substrate in line with the channel region and whose respective distal ends are aligned with a part of the first active region and with a part of the second active region, respectively, which gate is permanently held at ground potential, and
a gate oxide layer running between the gate and the surface of the substrate.

The method comprises the application of a breakdown voltage onto the first or the second active region of the MOS storage transistor, so as to induce breakdown of the gate oxide layer between the gate and the said first active region or between the gate and the said second active region, respectively.

Lastly, a fourth embodiment of the invention relates to a method of reading a memory cell, comprising a MOS storage transistor, having:
a semiconductor substrate,
first and second active regions formed under the surface of the substrate being separated by a part of the substrate forming a channel region,
a gate formed on the surface of the said substrate in line with the channel region and whose respective distal ends are aligned with a part of the first active region and with a part of the second active region, respectively, which gate is permanently held at ground potential, and
a gate oxide layer running between the gate and the surface of the substrate.

The method comprises the precharging of the region of the first or of the second active region of the MOS storage transistor, and the detection of a discharge current between the said first active region and ground or between the said second active region and ground, respectively.

BRIEF DESCRIPTION OF THE SEVERAL VIEWS OF THE DRAWING(S)

Further features and advantages of the invention will become apparent upon reading the description that follows. The latter is presented purely by way of illustration and must be read with regard to the appended drawings in which.

DETAILED DESCRIPTION OF THE INVENTION

In the figures and in the description that follows, the same elements carry the same references.

Figure 1:
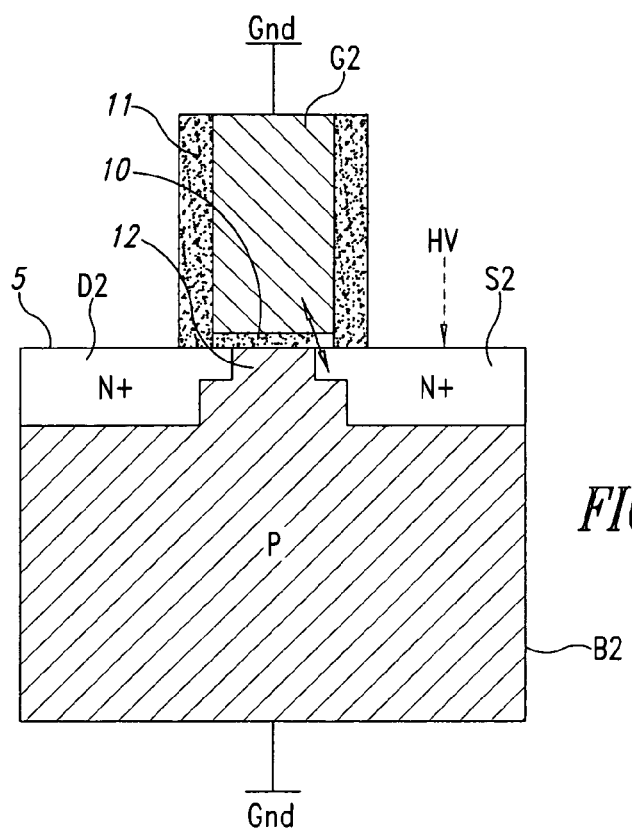
FIG. 1 is a cross-sectional view of an exemplary embodiment of an n-MOS transistor, which can be used as a MOS storage transistor in one embodiment of the present invention.

An exemplary embodiment of the present invention using only n-MOS transistors is described hereafter, although the invention may also be implemented by means of only p-MOS transistors, or of n-MOS and p-MOS transistors using CMOS (Complementary Metal Oxide Semiconductor) technology. Transistors of the n-MOS type are preferred for reasons of speed associated with the higher mobility of the charge carriers, namely electrons, in this type of transistor. FIG. 1 shows, in cross section, an n-MOS transistor capable of being used as a MOS storage transistor according to the invention.

The transistor comprises a substrate B2 made of semiconductor material, typically silicon. Being an n-MOS transistor, it is formed more particularly inside a well of p-doped semiconductor material. In the example shown, the substrate is p-doped such that the aforementioned well corresponds to the substrate itself.

Under the surface S of the substrate, the n-MOS transistor comprises two active regions respectively forming the source S2 (for example on the right-hand side of the figure) and the drain D2 (on the left-hand side of the figure) of the transistor. Being an n-MOS transistor, these active regions are obtained by implanting dopant species of negative polarity (for example $P^-$ ions) into the substrate. For a p-MOS transistor, these regions would be obtained by implanting dopant species of positive polarity (for example $B^+$ ions).

The transistor also comprises a gate G2 formed on the surface S of the substrate according to techniques of deposition, etching and lift-off known per se. The gate G2 essentially comprises a region of polysilicon (poly-Si) obtained on the surface S of the substrate. An oxide layer 10, for example silicon dioxide ($SiO_2$), runs between the gate G2 and the surface S of the substrate. In addition, a spacer 11 made of insulating material such as $SiO_2$ is formed so as to surround the gate G2.

The gate G2 is aligned with a part of the substrate B2 that separates the active regions S2 and D2 and forms a channel region 12. The respective distal ends of the gate G2 are aligned with a part of the active region S2 (on the right-hand side of the figure) and with a part of the active region D2 (on the left-hand side of the figure). For example, these parts of the regions S2 and D2 may correspond to extension regions of the source and of the drain of the transistor, respectively. These extension regions are regions that have a lower concentration of dopant species than that of the remainder of the source and of the drain, respectively. These extension regions are also called LDD (Lightly Doped Drain) in the jargon of those skilled in the art. Their purpose is to reduce the leakage currents within the transistor.

According to one embodiment of the invention, breakdown is induced in the oxide layer 10 between the gate G2 and the source S2 in order to program a given logic value, for example the logic value "1". The complementary logic value, namely the logic value "0" in the example considered here, corresponds to the inverse intact state of the oxide layer 10 between the gate G2 and the source S2. In the same way, the intact or broken down state of the oxide layer 10 between the gate G2 and the active region D2 of the transistor determines another logic value, "0" or "1" respectively, in the example considered here. In other words, the n-MOS transistor can be used as a MOS storage transistor allowing the values of two bits of information to be stored. The invention exploits this property as will now be described.

Since the transistor is of the n-MOS type, the substrate B2 is typically connected to ground potential GND. This is the reason why, in an embodiment of the memory device using a MOS storage transistor that is an n-MOS transistor, the gate G2 of this transistor is permanently held at ground potential GND. In order to cause the breakdown of the oxide layer 10 between the gate G2 and the source S2, a high voltage HV is applied to the latter. The term "high voltage" means a voltage that is substantially higher than the voltage normally applied to the control gate of such a transistor, which is around 5 $mV/cm^2$. For example, HV=20 $mV/cm^2$. The breakdown of the oxide layer 20 thus obtained is symbolized in FIG. 1 by a double-ended arrow linking the gate G2 to the source S2, the voltage HV being applied to the latter. The breakdown of the oxide layer 10 results in a conducting path being formed between the gate G2 and the source S2. This feature is used for reading the memory device.

More details will be presented below, together with implementation examples relating to methods of writing and reading in the memory device according to the invention.

Figure 2:
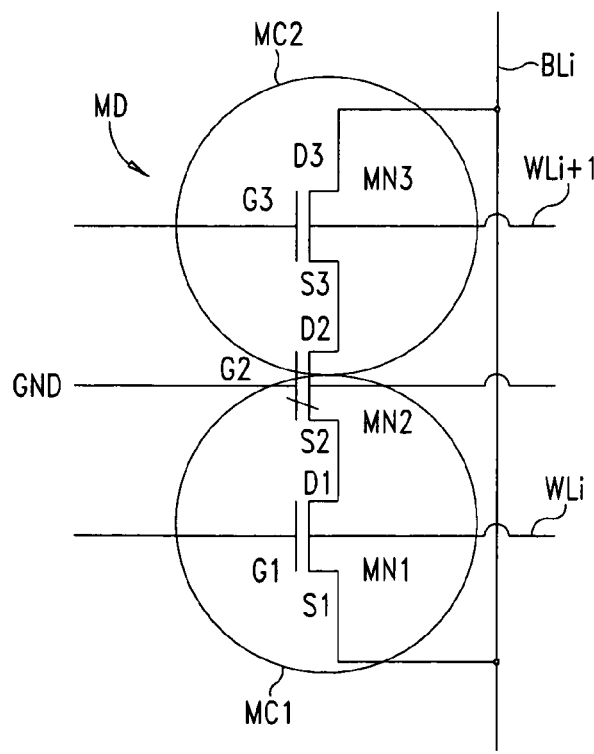
FIG. 2 is a circuit diagram of a dual-bit memory device, according to one embodiment of the present invention.

FIG. 2 presents a circuit diagram of a memory device MD according to one embodiment using n-MOS transistors.

The memory device MD comprises a MOS storage transistor MN2 such as the n-MOS transistor that has been described herein above with regard to the diagram in FIG. 1. Conventionally, the substrate of the transistor MN2 is connected to the electrical ground of the device. The gate G2 of the transistor MN2 is permanently connected to the electrical ground of the device in order to receive ground potential GND.

As has been stated, the transistor MN2 allows 2 bits of information to be stored. This is the reason why the device MD also comprises a first MOS access transistor MN1 for accessing one of these bits, together with a second MOS access transistor MN3 for accessing the other one of these bits.

In other words, the device MD comprises two memory cells MC1 and MC2. The memory cell MC1 comprises, on the one hand, half of the transistor MN2, corresponding to its gate G2 and its source S2, and, on the other, the access transistor MN1. The memory cell MC2 comprises, on the one hand, the other half of the transistor MN2 corresponding to its gate G2 and to its drain D2, and, on the other, the access transistor MN3. The gate G1 of the transistor MN1 is connected to a word line WLi, its source S1 is connected to a bit line BLi, and its drain D1 is connected to the source S2 of the transistor MN2. Similarly, the gate G3 of the transistor MN3 is connected to another word line WLi+1, different from the word line WLi, its drain D3 is connected to the bit line BLi (or, as a variant, to another bit line of the memory plane), and its source S3 is connected to the drain D2 of the transistor MN2.

Preferably, the transistor MN2 is a thin-oxide MOS transistor, denoted by the proprietary term GO1 (Gate Oxide 1), for example a transistor whose channel length is equal to 130 nm and whose gate oxide thickness is substantially equal to 2.3 nm. The nominal operating voltage of such a transistor, commonly denoted Vdd, is equal to around 1.2 V. Consequently, a voltage HV, for example equal to 5 V, is high enough to cause the breakdown of the gate oxide layer 10 of the transistor MN2.

In a first embodiment, the access transistors MN1 and/or MN3 are thick-oxide MOS transistors, known under the proprietary term GO2 (Gate Oxide 2). Such transistors typically have a gate oxide layer whose thickness is in the range 5 to 6.5 nm.

The nominal operating voltage Vdd of such a transistor is around 3 V. Such a thick-oxide transistor can withstand the high programming voltages applied during the programming of a logic "1" value in the MOS storage transistor.

The memory device is therefore fabricated according to a standard dual gate oxide (or DGO) technology.

In another embodiment, the access transistors MN1 and MN3 are also transistors of the GO1 type, in other words using a thin oxide. Surprisingly, these transistors withstand well the high programming voltages applied during the programming process. Indeed, when such a transistor conducts, a channel forms between the source and the drain, which channel protects the gate oxide layer against the risk of breakdown. This embodiment is advantageous since it allows just a single type of transistor to be employed, which simplifies the fabrication process.

Figure 3:
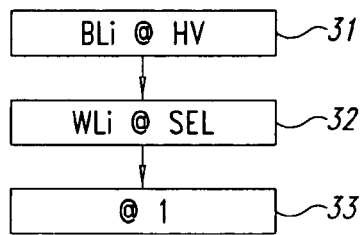
FIG. 3 is a flow diagram illustrating the programming of a logic '1' in a memory device according to the present invention.

The flow diagram in FIG. 3 illustrates steps in an example of writing method of a given logic value, for example '1', for the memory device MD in FIG. 2, in particular for the memory cell MC1 formed from the lower half of the transistor MN2, on the one hand, and from the access transistor MN1 on the other.

In a step 31, a high programming voltage HV, or breakdown voltage, which is for example equal to 5 V, is applied to the bit line BLi. In a step 32, a selection voltage SEL, which is for example equal to 7 V, is applied to the word line WLi. Thus, the access transistor MN1 is in the on-state, and the source S2 of the transistor MN2 will have the voltage HV.

The application of the breakdown voltage HV to the source S2 of the transistor MN2 causes, in a step 33, the breakdown of the gate oxide layer 10 between the gate G2 and the source S2 of the transistor MN2. By convention, it is considered that the logic value "1" is then programmed into the transistor MN2.

It should be noted that the beginning and the end of steps 31 and 32 are not key—what counts is that these steps be carried out simultaneously over a sufficiently long period in order to bring about step 33 for the breakdown of the gate oxide layer 10.

Figure 4:
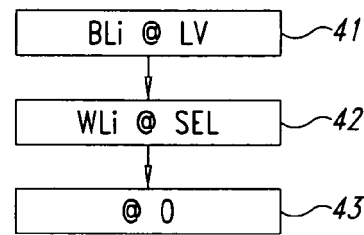
FIG. 4 is a flow diagram illustrating the programming of a logic '0' in a memory device according to the present invention.

The flow diagram in FIG. 4 illustrates the corresponding steps for writing the logic value '0'.

In a step 41, a low programming voltage LV, which is for example equal to 2 V, is applied to the bit line BLi. In a step 42, the selection voltage SEL is applied to the word line WLi. Thus, the access transistor MN1 is in the on-state, and the source S2 of the transistor MN2 has the voltage LV.

This voltage LV applied to the source S2 of the transistor MN2 is however insufficient to cause the breakdown of the gate oxide layer 10 between the gate G2 and the source S2 of the transistor MN2. By convention, it is considered that the logic value '0' is then programmed into the transistor MN2, which is symbolized in the figure by a step 43.

Figure 5:
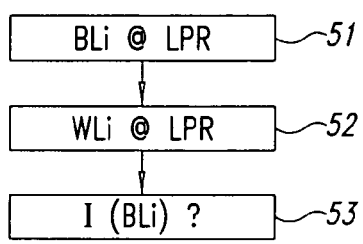
FIG. 5 is a flow diagram illustrating low-power reading in a memory device according to the present invention.

The flow diagram in FIG. 5 illustrates a first mode of implementation of a read operation in the memory device MD in FIG. 2, in particular for reading the data stored in the memory cell MC1 comprising the lower part of the transistor MN2 and the access transistor MN1.

In a step 51, the bit line BLi is precharged with a voltage LPR called low-power read voltage. The voltage LPR is for example equal to 1.2 V, which corresponds substantially to the nominal operating voltage Vdd of the device.

In a step 52, the voltage LPR is also applied to the word line WLi. This makes the access transistor MN1 conduct. In a step 53, the discharge of the bit line BLi to ground is detected. This discharge takes place through the transistor MN1 and the conducting path that would be formed between the source S2 and the gate G2 of the transistor MN2, if the gate oxide layer 10 of this transistor has been broken down between the source S2 and the gate G2 (during the write operation of the logic value "1" in the memory cell being considered).

The discharge current is typically in the range 100 nA to 10 µA. It is therefore much higher than the normal leakage current of the transistor which is of the order of a few pA. It can therefore be readily detected.

Figure 6:
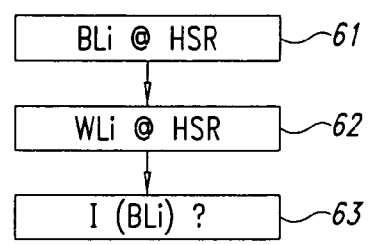
FIG. 6 is a flow diagram illustrating high-speed reading in a memory device according to the present invention.

The flow diagram in FIG. 6 illustrates a second mode of implementation of the read operation. In this mode of implementation, steps 61 to 63 correspond to steps 51 to 53, respectively. Nevertheless, instead of using the low-power read voltage LPR, a voltage HSR, called the high-speed read voltage, is used. The voltage HSR is for example equal to 3 V.

This mode of implementation of the read operation yields faster reading, since the discharge current increases as the square of the read voltage, i.e., it depends on $V^2$ where V is the value of the read voltage LPR or HSR.

Figure 7:
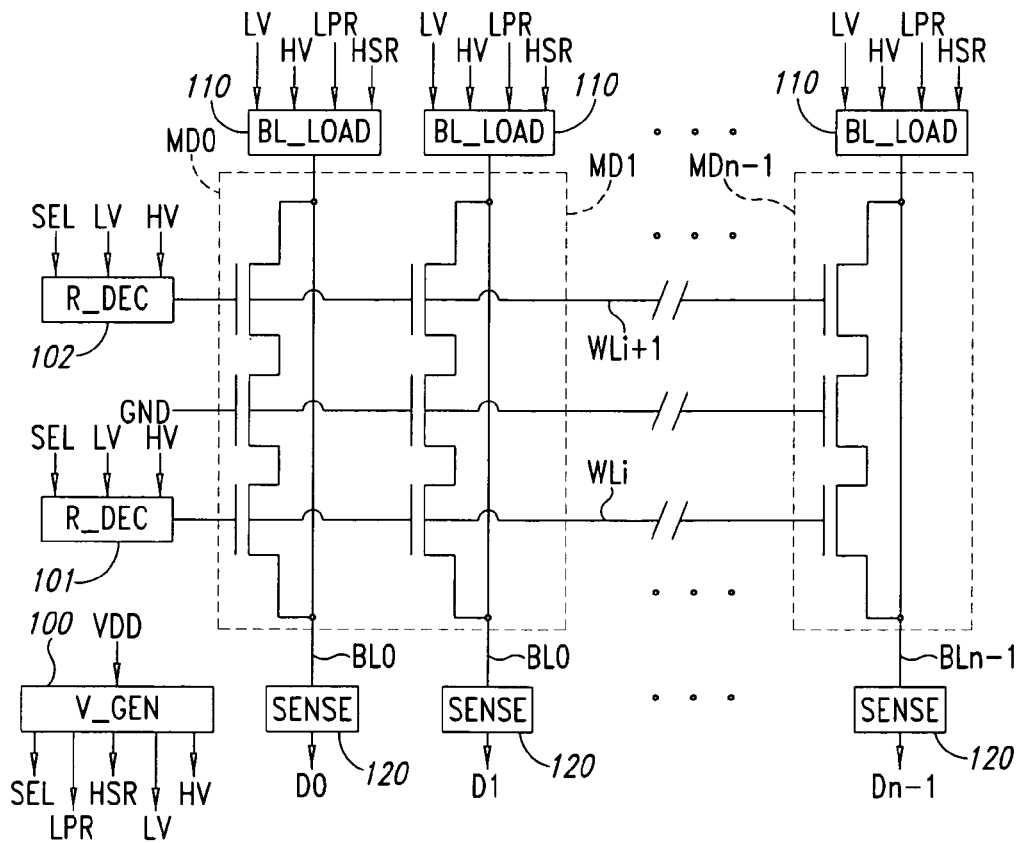
FIG. 7 is a circuit diagram of an exemplary embodiment of a memory according to the second aspect of the invention.

FIG. 7 illustrates an exemplary embodiment of a memory according to another aspect of the invention.

In this example, the memory comprises a given number N of memory devices, MD0 to MDn−1 respectively, each being of the type described above with reference to the diagram in FIG. 2.

The memory plane of the memory comprises N bit lines BL0 to BLn−1 and two word lines WLi and WLi+1. One of the access transistors of the memory devices MD0 to MDn−1 is coupled to the word line WLi via its control gate, and the other access transistor is coupled to the word line WLi+1 via its control line. In addition, the two access transistors of the memory devices MD0 to MDn−1 are coupled to the same bit line, BL0 to BLi−1 respectively, via their source or their drain. In other words, in this exemplary embodiment, the two memory cells of the same memory device are coupled to the same bit line.

Row decoder circuits 101 and 102 are respectively coupled to the word lines WLi and WLi+1. These row decoders receive the voltages SEL, LV and HV. The function of these row decoders is to select the word line to which a given memory cell is coupled, when it is desired to access this memory cell for writing or reading. Similarly, column decoders 110, which are respectively coupled to the bit lines BL0 to BLn−1, have the function of selecting the bit line to which the memory cell is coupled to which access is required for writing or reading. The column decoders 110 receive the voltages LV, HV, LPR and HSR.

In addition, a detection circuit 120 is coupled to each bit line BL0 to BLn−1 in order to detect the discharge current on the bit line during a read operation in a memory cell coupled to the said bit line. The detection circuits 120 coupled to the bit lines BL0 to BLn−1 can thus deliver information data bits D0 to Dn−1, respectively, which correspond to the logic value stored in the memory cell located at the intersection between the word line and the bit line selected. Thus, as will be understood from the above, the memory shown in FIG. 7 allows 2×N bits of information to be stored.

Lastly, the memory comprises a voltage generation circuit 100 comprising devices such as charge pump and voltage multiplier, in order to generate the service voltages SEL, LPR, HSR, LV and HV, as a function of the power supply voltage VDD of the memory device.

Advantageously, the memory shown in FIG. 7 occupies a reduced surface area. In practice, for the 130 nm technology standard, a value of surface area below 1 $\mu m^2$/bit may be attained.

The invention has been described above in embodiments that are non-limiting. In particular, the MOS storage transistor can be a p-MOS transistor instead of an n-MOS transistor, although an n-MOS transistor is preferred for its speed. Similarly, one of the access transistors, or both, can be p-MOS transistors instead of n-MOS transistors. This may be advantageous since it allows a higher voltage to be applied to the active regions, and this therefore facilitates the breakdown of the gate oxide layer in these active regions.

Similarly, the example of memory described with reference to FIG. 7 is in no way limiting. Any number of word lines may be used, either odd or even, although it is advantageous to use an even number of word lines since each storage transistor incorporates two memory cells.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A one-time programmable, dual-bit memory device, comprising:
   one MOS storage transistor that includes first and second memory cells storing first and second bits, respectively, the MOS storage transistor having:
      a semiconductor substrate,
      first and second active regions formed under a surface of the substrate and being separated by a part of the substrate forming a channel region,
      a gate formed on the surface of the substrate in line with the channel region, the gate having respective distal ends aligned with a part of the first active region and with a part of the second active region, respectively, which gate is permanently held at ground potential, and
      a gate oxide layer running between the gate and the surface of the substrate, the first memory cell including a first portion of the gate oxide layer, the first portion having an intact or a broken down state between the gate and the first active region that determines a stored value of the first bit, and the memory cell including a second portion of the gate oxide layer, the second portion having an intact or a broken down state between the gate and the second active region that determines a stored value of the second bit;
   a first MOS access transistor for access to the first bit, the first MOS access transistor being connected between a bit line and the first active region, being formed on the substrate surfaces, being structured to cause breakdown of the first portion of the gate oxide layer when the first access transistor is turned on and a write voltage is applied to the bit line, and including:
      a gate connected to a first word line,
      a first active region connected to the bit line, and
      a second active region connected to the first active region of the MOS storage transistor; and
   a second MOS access transistor for access to the second bit, formed on the substrate surface and including:
      a gate connected to a second word line,
      a first active region connected to a bit line, and
      a second active region connected to the second active region of the MOS storage transistor.

2. A device according to claim 1, wherein the MOS storage transistor is a thin-oxide MOS transistor.

3. A device according to claim 1, wherein at least one of the first MOS access transistor and the second MOS access transistor is a thin-oxide MOS transistor.

4. A device according to claim 1, wherein at least one of the first MOS access transistor and the second MOS access transistor is a thick-oxide MOS transistor.

5. A device according to claim 1, wherein the first active region of each MOS access transistor is connected to the same bit line.

6. A device according to claim 1, wherein the MOS storage transistor is an NMOS transistor.

7. A device according to claim 1, wherein the MOS access transistors are PMOS transistors.

8. A one-time programmable memory, comprising:
   a first word line;
   a second word line;
   at least one bit line; and
   a first memory device including:
      a first MOS storage transistor that includes first and second memory cells storing first and second bits, respectively, the first MOS storage transistor having:
         a semiconductor substrate,
         first and second active regions formed under a surface of the substrate and being separated by a part of the substrate forming a first channel region,
         a gate formed on the surface of the substrate in line with the channel region, the gate having respective distal ends aligned with a part of the first active region and with a part of the second active region, respectively, which gate is permanently held at ground potential, and
         a gate oxide layer running between the gate and the surface of the substrate, the first memory cell including a first portion of the gate oxide layer, the first portion having an intact or a broken down state between the gate and the first active region that determines a stored value of the first bit, and the memory cell including a second portion of the gate oxide layer, the second portion having an intact or a broken down state between the gate and the second active region that determines a stored value of the second bit;

a first MOS access transistor for access to the first bit, the first MOS access transistor being connected between a bit line and the first active region, being formed on the substrate surface, being structured to cause breakdown of the first portion of the gate oxide layer when the first access transistor is turned on and a write voltage is applied to the bit line, and including:
a gate connected to the first word line,
a first active region connected to the at least one bit line, and
a second active region connected to the first active region of the MOS storage transistor; and a second MOS access transistor for access to the second bit, formed on the substrate surface and including:
a gate connected to the second word line,
a first active region connected to the at least one bit line, and
a second active region connected to the second active region of the MOS storage transistor.

9. A memory according to claim 8, wherein the MOS storage transistor is a thin-oxide MOS transistor.

10. A memory according to claim 8, wherein at least one of the first MOS access transistor and the second MOS access transistor is a thin-oxide MOS transistor.

11. A memory according to claim 8, wherein at least one of the first MOS access transistor and the second MOS access transistor is a thick-oxide MOS transistor.

12. A memory according to claim 8, wherein the first active region of each MOS access transistor is connected to a first bit line of the at least one bit line.

13. A memory according to claim 12, further comprising:
a second memory device including:
a second MOS storage transistor having:
first and second active regions formed under the surface of the substrate and being separated by a part of the substrate forming a second channel region,
a gate formed on the surface of the substrate in line with the second channel region, the gate having respective distal ends aligned with respective parts of the first and second active regions of the second MOS storage transistor, which gate is permanently held at ground potential, and
a gate oxide layer running between the gate of the second MOS storage transistor and the surface of the substrate, the gate oxide layer having an intact or a broken down state between the gate and the first active region of the second MOS storage transistor that determines a stored value of a third bit, and having an intact or a broken down state between the gate and the second active region of the second MOS storage transistor that determines a stored value of a fourth bit;
a third MOS access transistor for access to the third bit, formed on the substrate surface and including:
a gate connected to the first word line,
a first active region connected to a second bit line of the at least one bit line, and
a second active region connected to the first active region of the MOS storage transistor; and
a fourth MOS access transistor for access to the fourth bit, formed on the substrate surface and including:
a gate connected to the second word line,
a first active region connected to the second bit line, and
a second active region connected to the second active region of the MOS storage transistor.

14. A one-time programmable memory device, comprising:
a first memory cell that stores a first bit of data, the first memory cell including a first portion of a gate dielectric layer of a storage transistor, the first portion of the gate dielectric layer being positioned between a gate and a first active region of the storage transistor, the first bit of data being stored based on whether the first portion of the gate dielectric is intact or broken;
a second memory cell that stores a second bit of data, the second memory cell including a second portion of the gate dielectric layer of the storage transistor, the second portion of the gate dielectric layer being positioned between the gate and a second active region of the storage transistor, the second active region being separated from the first active region by a channel region, the second bit of data being stored based on whether the second portion of the gate dielectric is intact or broken; and
a first access transistor connected between a first bit line and the first active region and including a control terminal connected to a word line, the first access transistor being structured to cause breakdown of the first portion of the gate dielectric layer when the first access transistor is turned on and a write voltage is applied to the bit line.

15. The memory device of claim 14, further comprising:
a second access transistor connected between a second bit line and the second active region and including a control terminal connected to the word line, the second access transistor being structured to cause breakdown of the second portion of the gate dielectric layer when the second access transistor is turned on and a write voltage is applied to the bit line.

16. The memory device of claim 15, wherein the storage transistor is a thin-oxide storage transistor and at least one of the first access transistor and the second access transistor is a thin-oxide MOS transistor.

17. The memory device of claim 15, wherein the storage transistor is a thin-oxide storage transistor and at least one of the first access transistor and the second access transistor is a thick-oxide MOS transistor.

18. The memory device of claim 14, wherein the storage transistor is a thin-oxide MOS transistor.

19. The memory device of claim 14 wherein the gate is positioned on a surface of a substrate in line with the channel region, the gate having respective distal ends aligned with a part of the first active region and with a part of the second active region, respectively.

* * * * *